(12) United States Patent
Kim et al.

(10) Patent No.: US 9,183,082 B2
(45) Date of Patent: Nov. 10, 2015

(54) ERROR DETECTION AND CORRECTION OF ONE-TIME PROGRAMMABLE ELEMENTS

(71) Applicant: QUALCOMM Incorporated, San Diego, CA (US)

(72) Inventors: Jung Pill Kim, San Diego, CA (US); Taehyun Kim, San Diego, CA (US); Sungryul Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 154 days.

(21) Appl. No.: 13/752,419

(22) Filed: Jan. 29, 2013

(65) Prior Publication Data
US 2014/0215294 A1 Jul. 31, 2014

(51) Int. Cl.
*G06F 7/02* (2006.01)
*G06F 11/10* (2006.01)
*G11C 17/02* (2006.01)
*G11C 17/14* (2006.01)
*G11C 17/18* (2006.01)
*G11C 29/02* (2006.01)
*G11C 29/44* (2006.01)

(52) U.S. Cl.
CPC ............ *G06F 11/1048* (2013.01); *G11C 17/02* (2013.01); *G11C 17/146* (2013.01); *G11C 17/18* (2013.01); *G11C 29/027* (2013.01); *G11C 2029/4402* (2013.01)

(58) Field of Classification Search
CPC ....... G06F 11/10; G06F 7/02; G06F 11/0751; H05K 999/99; H04L 1/0061
USPC ........................................................ 714/819
See application file for complete search history.

(56) References Cited

U.S. PATENT DOCUMENTS

| 6,092,193 | A  | * | 7/2000  | Loomis et al. ................. 713/193 |
| 7,003,713 | B2 |   | 2/2006  | Rodgers |
| 7,047,381 | B2 |   | 5/2006  | Bushner |
| 7,178,067 | B2 |   | 2/2007  | Wuidart |
| 8,194,437 | B2 |   | 6/2012  | Chen et al. |
| 8,209,476 | B2 |   | 6/2012  | Moore et al. |
| 2001/0039601 | A1 | * | 11/2001 | Leung et al. .................. 711/101 |
| 2003/0179616 | A1 |   | 9/2003  | Wohlfahrt et al. |
| 2007/0025151 | A1 | * | 2/2007  | Lee .......................... 365/185.11 |
| 2007/0033449 | A1 |   | 2/2007  | Hwang et al. |
| 2011/0128771 | A1 | * | 6/2011  | Rao ............................... 365/148 |
| 2013/0227374 | A1 | * | 8/2013  | Desireddi ..................... 714/758 |

FOREIGN PATENT DOCUMENTS

EP  1912121 A1  4/2008
JP  S60201599 A  10/1985

OTHER PUBLICATIONS

International Search Report and Written Opinion for International Application No. PCT/US2014/012539, ISA/EPO, Date of mailing May 8, 2014, 12 pages.

* cited by examiner

*Primary Examiner* — Albert Decady
*Assistant Examiner* — Enam Ahmed
(74) *Attorney, Agent, or Firm* — Toler Law Group, PC

(57) ABSTRACT

A circuit includes a first one-time programmable (OTP) element and a second OTP element. The circuit also includes error detection circuitry coupled to receive a first representation of data from the first OTP element. The circuit further includes output circuitry responsive to an output of the error detection circuitry to output an OTP read result based on the first representation of the data or based on a second representation of the data from the second OTP element.

27 Claims, 5 Drawing Sheets

| FLAG_DED_L | FLAG_DED_R | SEL | DOUT |
| --- | --- | --- | --- |
| 0 | 0 | 0 or 1 | DOUT_L or DOUT_R |
| 0 | 1 | 0 | DOUT_L |
| 1 | 0 | 1 | DOUT_R |
| 1 | 1 | 0 or 1 | Error |

*FIG. 2*

ERROR DETECTION AND CORRECTION OF ONE-TIME PROGRAMMABLE ELEMENTS

I. FIELD

The present disclosure is generally related to error detection and correction of one-time programmable elements.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Electronic devices such as wireless telephones may include one-time programmable (OTP) elements that can be written (e.g., programmed) once. For example, OTP elements may collectively form a read-only memory. To increase reliability, OTP elements may be arranged in a dual OTP configuration. In a dual OTP configuration, a logical OR operation is performed on a read output from each of two OTP elements to determine an overall read output. Thus, reliability may be improved at the cost of doubled memory size.

OTP elements can be implemented using various devices. For example, e-fuses or anti-fuses may be used to implement an OTP memory. When e-fuses or anti-fuses are used, an unblown fuse represents a logic zero and a blown fuse represents a logic one, Programming failures for an OTP element can occur in the case of a non-blown e-fuse or a non-blown gate oxide for an anti-fuse (i.e., an erroneous logic zero). However, if the other OTP element of the dual configuration has been programmed correctly (i.e., contains a logic one), performing the logical OR operation on the read outputs can overcome the programming failure.

Another type of device that may be used to implement OTP elements is a magnetic tunnel junction (MTJ) device. MTJ devices may be preferable to e-fuses/anti-fuses because MTJ devices may not require as high a programming voltage as e-fuses/anti-fuses, a negative voltage, or a large programming current. To program a MTJ OTP element, a magnesium oxide (MgO) tunnel barrier layer of the MTJ may be broken. However, the tunnel barrier layer may also break down due to wear and tear during operation, which results in a post-programming error (e.g., a logic zero may turn into a logic one). Because the logic one resulting from MTJ oxide breakdown (e.g., due to wear and tear) is erroneous, performing a logical OR operation on read outputs in a dual MTJ OTP configuration does not provide the correct output in the case of MTJ oxide breakdown. Performing the logical OR operation would result in inclusion of the erroneous logic one in the read output.

III. SUMMARY

Systems and methods of error detection and correction that can be used with MTJ OTP elements are disclosed. For example, each of dual MTJ OTP element banks (e.g., memories) may include or be connected to an error correction code (ECC) decoder, such as a single error correction (SEC) and double error detection (DED) (SEC-DED) decoder. Each of the decoders may generate a flag during read operations. When only one error is detected in data, the decoder may correct the error and output the flag at a first (e.g., de-asserted or zero) value. When more than one error is detected, the decoder may be unable to correct all of the errors, and may therefore output the flag at a second (e.g., asserted or one) value. When one of the decoders asserts its flag but the other decoder does not, output from the non-asserting decoder may be provided as the "correct" read output of the dual MTJ OTP configuration. When neither flag is asserted, data from either of the decoders may be provided. When both flags are asserted (i.e., both decoders encountered an uncorrectable error), an error signal may be generated.

Various types of ECCs may be used in conjunction with the described technique. For example, Hamming codes may be used. As another example, parity bits may be generated and stored in the OTP elements. In another implementation, cyclic redundancy check (CRC)-based decoders may be used instead of SEC-DED decoders. In addition, it should be noted that the described techniques may be used with non-MTJ type OTPs as well.

In a particular embodiment, a circuit includes a first OTP element and a second OTP element. The circuit also includes error detection circuitry coupled to receive a first representation of data from the first OTP element. The circuit further includes output circuitry responsive to an output of the error detection circuitry to output an OTP read result based on the first representation of the data or based on a second representation of the data from the second OTP element.

In another particular embodiment, a method includes generating a first flag based on a first representation of data stored in a first OTP element, where the first flag indicates whether the first representation of the data includes any uncorrectable errors. The method also includes generating a second flag based on a second representation of the data stored in a second OTP element, where the second flag indicates whether the second representation of the data includes any uncorrectable errors. The method further includes, responsive to the first flag and the second flag, generating a read output based on the first representation of the data or the second representation of the data.

In another particular embodiment, an apparatus includes a first OTP element and a second OTP element. The apparatus also includes means for receiving a first representation of data from the first OTP element. The apparatus further includes means, responsive to an output of the means for receiving, for outputting an OTP read result based on the first representation of the data or based on a second representation of the data from the second OTP element.

In another particular embodiment, a method includes a step for generating a first flag based on a first representation of data stored in a first OTP element, where the first flag indicates whether the first representation of the data includes any uncorrectable errors. The method also includes a step for generating a second flag based on a second representation of the data stored in a second OTP element, where the second flag indicates whether the second representation of the data includes any uncorrectable errors. The method further includes a step for, responsive to the first flag and the second flag, generating a read output based on the first representation of the data or the second representation of the data.

In another particular embodiment, a non-transitory computer-readable medium includes instructions that, when executed by a processor, cause the processor to cause generation of a first flag based on a first representation of data stored in a first OTP. The first flag indicates whether the first representation of the data includes any uncorrectable errors. The instructions are also executable by the processor to cause generation of a second flag based on a second representation of the data stored in a second OTP element. The second flag indicates whether the second representation of the data includes any uncorrectable errors. The instructions are further executable by the processor to, responsive to the first flag and the second flag, cause generation of a read output based on the first representation of the data or the second representation of the data.

In another particular embodiment, a method includes receiving design information representing at least one physical property of a semiconductor device, the semiconductor device including a first OTP element and a second OTP element. The semiconductor device also includes error detection circuitry coupled to receive a first representation of data from the first OTP element and output circuitry responsive to an output of the error detection circuitry to output an OTP read result based on the first representation of the data or based on a second representation of the data from the second OTP element. The method includes transforming the design information to comply with a file format and generating a data tile including the transformed design information.

One particular advantage provided by at least one of the disclosed embodiments is an ability to perform error detection and correction of OTP memories, including memory in a dual MTJ OTP configuration. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

FIG. 2 is a table to illustrate a particular embodiment of operation of the output logic of FIG. 1;

V. DETAILED DESCRIPTION

Figure 1:
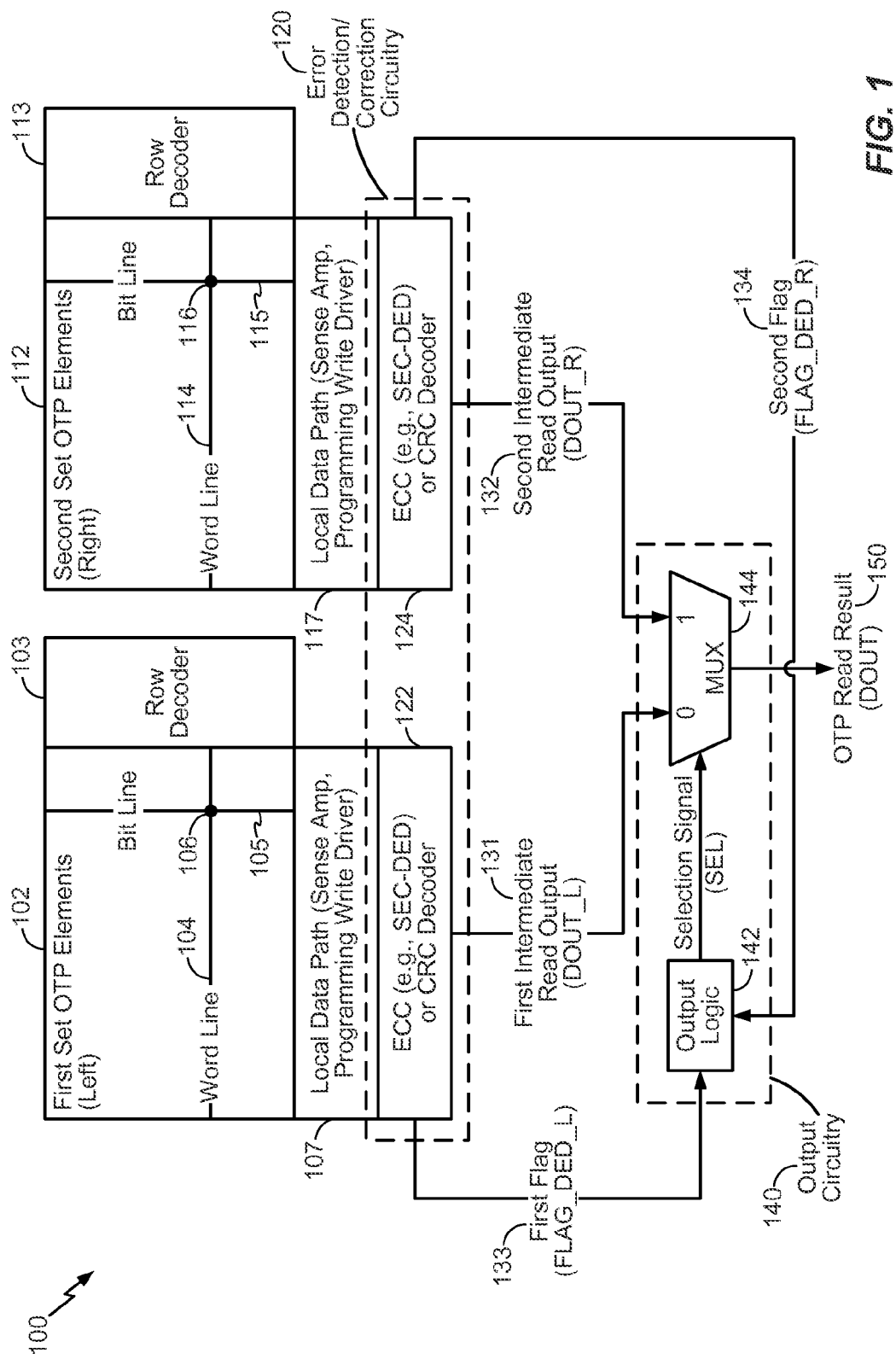
FIG. 1 is a diagram to illustrate a particular embodiment of a system that is operable to perform error detection and correction of OTP elements.

Referring to FIG. 1, a particular illustrative embodiment of a system that is operable to perform error detection and correction of one-time programmable (OTP) elements is shown and generally designated 100. The system 100 includes a first set of one or more first OTP elements 102 and a second set of one or more second OTP elements 112. For convenience, the first set of OTP elements 102 and circuitry/operations associated therewith are labeled "Left" or "L" and the second set of OTP elements 112 and circuitry/operations associated therewith are labeled "Right" or "R".

OTP elements may be written (e.g., programmed) once and read multiple times. Thus, OTP elements may represent read-only memory in the system 100. In the example of FIG. 1, the OTP elements 102 and 112 are arranged in a dual OTP configuration. Arranging OTP elements in a dual configuration may reduce the impact of OTP programming errors via redundancy. In a dual OTP configuration, an OTP read operation may include performing a local read on the individual OTPs and then determining which of the read outputs to select as a global read result.

The first set of OTP elements 102 may be coupled to a first row decoder 103 and the second set of OTP elements 112 may be coupled to a second row decoder 113. To read a particular OTP element (e.g., OTP elements 106 and 116), corresponding word lines 104, 114 and bit lines 105, 115 may be asserted (e.g., set to a logic high or logic one value). The number of bits that are read may depend on factors such as word size, alignment, and addressability. The read operation on the first set of OTP elements 102 may generate a first signal that is detected by a first local data path 107 of the first set of OTP elements 102. For example, the first local data path 107 may include one or more sense amplifiers (e.g., used during read operations) and programming write drivers (e.g., used during one-time programming of the first set of OTP elements 102). The read operation on the second set of OTP elements 112 may generate a second signal that is detected by a second local data path 117 of the second set of OTP elements 112. For example, the second local data path 117 may include one or more sense amplifiers (e.g., used during read operations) and programming write drivers (e.g., used during one-time programming of the second set of OTP elements 112).

The local data paths 107 and 117 may provide read data to error detection and correction circuitry 120. For example, a first error detection and correction decoder 122 may be coupled to the first OTP elements 102 and a second error detection and correction decoder 124 may be coupled to the second OTP elements 112. In a particular embodiment, at least one of the first decoder 122 and the second decoder 124 is an error correction code (ECC) decoder. For example, the ECC decoder may be a single error correction (SEC) and double error detection (DED) (SEC-DED) decoder. Alternately, or in addition, at least one of the first decoder 122 and the second decoder 124 may be a cyclic redundancy check (CRC) decoder. It should be noted that ECC decoders and CRC decoders are described by way of example only. Other types of error detection and correction circuitry may also be used in conjunction with the described techniques.

Each of the decoders 122 and 124 may generate a flag indicating whether data stored in the corresponding OTP elements 102 and 112 includes any uncorrectable errors. For example, the first decoder 122 may generate a first flag 133 and the second decoder 124 may generate a second flag 134. The first flag 133 may indicate whether a first representation of data stored in the first OTP elements 102 includes any uncorrectable errors and the second flag 134 may indicate whether a second representation of the data stored in the second OTP elements 112 includes any uncorrectable errors.

To illustrate, when the decoders 122 and 124 are SEC-DED decoders, the decoders 122 and 124 may be able to correct a single error and may be able to detect if the data includes two errors (i.e., an uncorrectable error). Thus, the first flag 133 may be asserted (e.g., set to a logic one value) when the first decoder 122 determines that the first representation of the data stored in the first OTP elements 102 includes more than one error. Similarly, the second flag 134 may be asserted when the second decoder 124 determines that the second representation of the data stored in the second OTP elements 112 includes more than one error. As another example, when the decoders 122 and 124 are CRC decoders, the flags 133 and 134 may be asserted when an error is detected and may be de-asserted when no error is detected.

Each of the decoders 122 and 124 may also generate an intermediate (e.g., local) read output. When the data stored in a particular OTP element includes correctable errors, the corresponding intermediate read output may be an error corrected version of the data. However, when the data includes an uncorrectable error, the corresponding intermediate read output may include the error. In the example of FIG. 1, the first decoder 122 generates a first intermediate read output 131 and the second decoder 124 generates a second intermediate read output 132. When a single bit is being read from the dual OTP configuration of FIG. 1, the intermediate read outputs 131 and 132 may each include a single bit. When multiple bits (e.g., an 8-bit word, a 32-bit word, etc.) is being read from the dual OTP configuration, the intermediate read outputs 131 and 132 may each include multiple (e.g., 8, 32, etc.) bits.

The error detection and correction circuitry 120 may provide the intermediate read outputs 131, 132 and the flags 133, 134 to output circuitry 140. In a particular embodiment, the output circuitry 140 includes output logic 142 that is configured to provide a selection signal to a multiplexer (MUX) 144. Based on the values of the flags 133 and 134, the output logic 142 may cause the MUX 144 to select the first intermediate read output 131 or the second intermediate read output 132 as an OTP read result 150 that is provided to a global data path of the system 100. A table illustrating a particular example of operation of the output logic 142 is further described with reference to FIG. 2.

It should be noted that the OTP elements 102 and 112 may be fuse or anti-fuse based OTP elements, magnetic tunnel junction (MTJ) OTP elements, or other types of OTP elements. When the OTP elements 102 and 112 are MTJ OTP elements, each MTJ OTP element may include a stack of layers. For example, from bottom to top, an MTJ stack (within an MTJ OTP element) may include a buffer layer, an antiferromagnetic (AF) pinning layer (e.g., made of platinum manganese (PtMn)), a synthetic AF pinned layer (e.g., including cobalt iron (CoFe), ruthenium (Ru), and cobalt iron boron (CoFeB) sublayers), a tunnel barrier layer (e.g., made of magnesium oxide (MgO)), a free layer (e.g., made of CoFeB), and a capping layer.

When used for OTP memory, a MTJ element may be programmed by breaking down (e.g., blowing) the tunnel barrier layer using a programming voltage. When the tunnel barrier layer is intact, the MTJ OTP element may represent a logic zero and may provide an electrical resistance of approximately 2-4 kiloohms, depending on whether the MTJ element is in a parallel state or an anti-parallel state. When the tunnel barrier layer is broken down, the MTJ OTP element may represent a logic one and may provide an electrical resistance that is an order of magnitude less (e.g., approximately 250 ohms). Thus, a comparison of the resistance of the MTJ OTP element against a reference resistance (e.g., 1.5 kiloohms) may be used to determine whether the MTJ OTP element represents a logic zero or a logic one. However, because the tunnel barrier layer of the MTJ OTP element is relatively thin (e.g., less than ten angstroms), the tunnel barrier layer may break down during lifetime operations (e.g., wear and tear) and/or due to process variations. As a result, a logic zero may be replaced with an erroneous logic one. The use of the error detection and correction circuitry 120 and the output circuitry 140 may correct such errors.

During operation, the OTP elements 102 and 112 may be programmed. For example when the OTP elements 102 and 112 are MTJ based, an eight-bit word "11110000" may be programmed by breaking down the barrier oxide layer of four OTP elements while leaving the barrier oxide layer of the next four OTP elements intact. Depending on the type of error detection and correction implemented by the circuitry 120, additional bit(s), such as parity bits, may also be programmed In a particular embodiment, seven parity bits may be generated for every thirty-two data bits. For example, the OTP element(s) 106 may be programmed correctly, but two programming errors may occur in the OTP elements(s) 116, resulting in "11000000" due to oxides that did not break down at the third and fourth bits.

After programming is completed, a read operation may be performed on the eight-bit word. For purposes of illustration, it is assumed that each of the decoders 122 and 124 are SEC-DED decoders. Thus, the first decoder 122 may output the first flag 133 with a de-asserted (e.g., zero) value because no uncorrectable errors exist in the representation of the eight-bit word stored in the left OTP elements 102, and the first intermediate read output 131 may be "11110000." However, the second decoder 124 may output the second flag 134 with an asserted (e.g., one) value, because an uncorrectable error exists in the representation of the eight-bit word stored in the right OTP elements 112 (e.g., because the SEC-DED decoder is not capable of correcting both of the programming errors). Thus, the second intermediate read output 132 may be incorrect.

The output logic 142 may receive the flags 133 and 134. As illustrated in the table of FIG. 2, when the first flag 133 is de-asserted and the second flag 134 is asserted, the output logic 142 may set the selection signal (SEL) such that the MUX 144 selects the first intermediate read output 131 as the OTP read result 150. Thus, the representation of the eight-bit word in the left OTP elements 102, which does not include any errors, may be selected as the OTP read result 150.

During lifetime operations (e.g., routine wear and tear) on the OTP elements 102 and 112, oxide breakdown may occur. For example, an oxide breakdown may occur in the last bit of the eight-bit word in the left OTP elements 102, resulting in "11110001." However, because only a single bit error has formed in the word, the first SEC-DED decoder 122 may be able to successfully correct the error during read operations, and the first intermediate read output 131 may still be "11110000." Thus, the first flag 133 may be de-asserted during the read operations, and the error corrected intermediate read output 131 may be selected as the OTP read result 150.

It should be noted that various types of ECCs may be used in the system 100 of FIG. 1. For example, Hamming codes may be used. As another example, parity bits may be generated and stored in the OTP elements 102 and 112. In another implementation, cyclic redundancy check (CRC)-based decoders may be used instead of SEC-DED decoders.

The system 100 of FIG. 1 may thus enable error detection and correction of OTP elements, including MTJ elements, in a dual OTP configuration. Unlike systems that perform a logical OR operation on read outputs, and therefore propagate an erroneous logic one value, the system 100 of FIG. 1 may use error correction techniques to detect and correct an erroneous logic one value. For example, an erroneous logic one value that results from MTJ oxide breakdown may be detected and corrected using the error detection and correction circuitry 120.

Referring to FIG. 2, a table 200 is shown to illustrate a particular embodiment of operation of the output logic 142 of FIG. 1. As shown in the table 200, when neither the first flag 133 (designated "FLAG_DED_L") nor the second flag 134 (designated "FLAG_DED_R") is asserted, either value of the selection signal (SEL) may be provided to the MUX 144, because both the first read output 131 (designated "DOUT_L") and the second read output 132 (designated "DOUT_R") are correct. However, when one of the flags 133, 134 is asserted and the other flag is de-asserted, the selection signal (SEL) may be generated such that the read output corresponding to the de-asserted flag is selected as the OTP read result 150 (designated "DOUT"). When both flags 133, 134 are asserted, either value of the selection signal (SEL) may be used because both read outputs 131, 132 are erroneous. In this case, an error signal may be generated.

Figure 3:
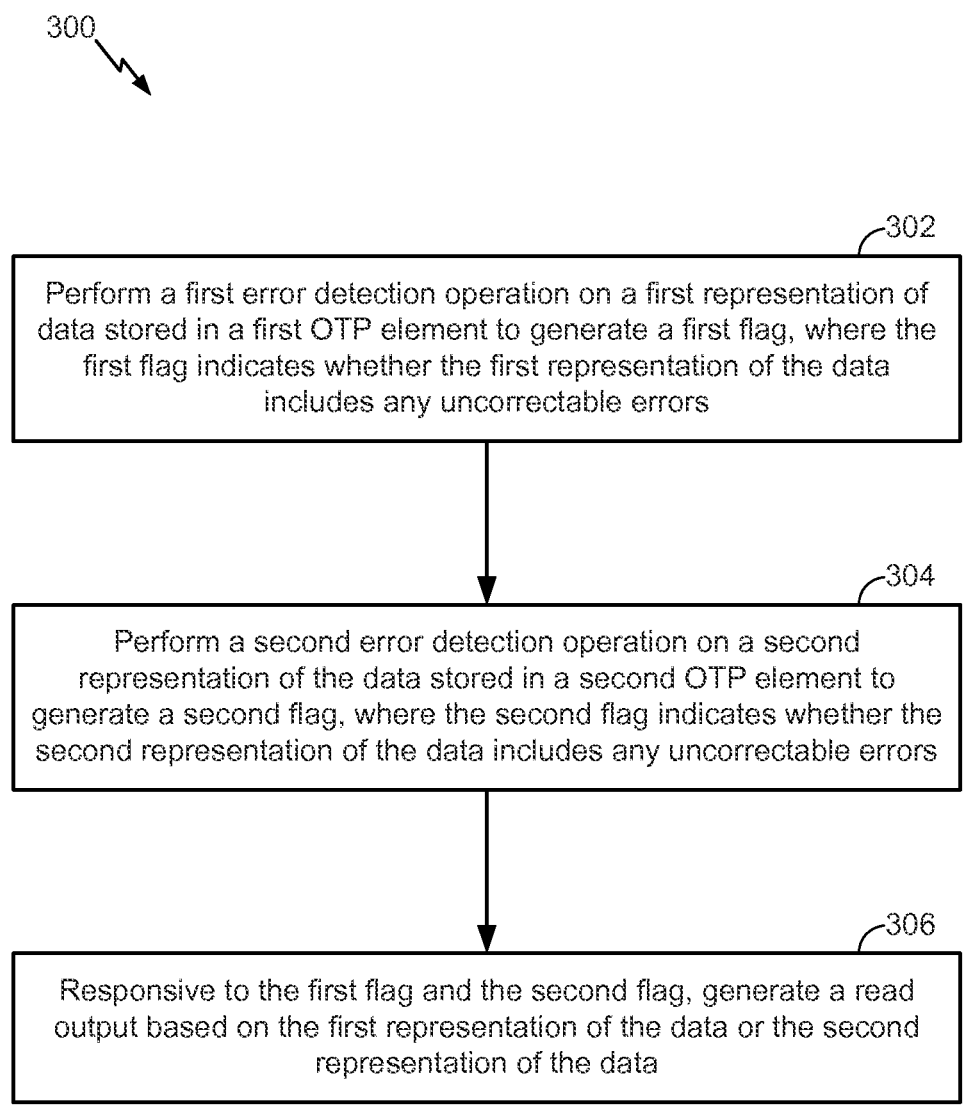
FIG. 3 is a flowchart to illustrate a particular embodiment of a method of performing error detection and correction of OTP elements.

Referring to FIG. 3, a flowchart of a particular embodiment of a method of performing error detection and correction of OTP elements is shown and generally designated 300. In an illustrative embodiment, the method 300 may be performed at he system 100 of FIG. 1.

The method 300 may include performing a first error detection operation on a first representation of data stored in a first OTP element to generate a first flag, at 302. The first flag may indicate whether the first representation of the data includes any uncorrectable errors. For example, in FIG. 1, the first decoder 122 may perform a first error detection operation on the first representation of the data stored in the OTP element(s) 106 and may generate the first flag 133. In a particular embodiment, the first decoder 122 may also perform an error correction operation in response to determining that the first representation of the data includes a correctable error. For example, when the first decoder 122 is a SEC-DED decoder and a single error exists in the first representation of the data, the first decoder 122 may correct the error.

The method 300 may also include performing a second error detection operation on a second representation of the data stored in a second OTP element to generate a second flag, at 304. The second flag may indicate whether the second representation of the data includes any uncorrectable errors. For example, in FIG. 1, the second decoder 124 may perform a second error detection operation on the second representation of the data stored in the OTP element(s) 116 and may generate the second flag 134. In a particular embodiment, the second decoder 124 may also perform an error correction operation in response to determining that the second representation of the data includes a correctable error. For example, when the second decoder 124 is a SEC-DED decoder and a single error exists in the second representation of the data, the second decoder 124 may correct the error.

The method 300 may further include, responsive to the first flag and the second flag, generating a read output based on the first representation of the data or the second representation of the data, at 306. For example, in FIG. 1, the MUX 144 may generate the OTP read result 150 based on the selection signal received from the output logic 142, where the selection signal is responsive to the first flag 133 and the second flag 134, as described with reference to the table 200 of FIG. 2.

The method 300 of FIG. 3 may thus enable error detection and correction of OTP elements, including MTJ elements, in a dual OTP configuration. Further, unlike systems that perform a logical OR operation on read outputs, and therefore propagate an erroneous logic one value, the method 300 of FIG. 3 may use error correction techniques to detect and correct an erroneous logic one value created due to MTJ oxide breakdown).

Figure 4:
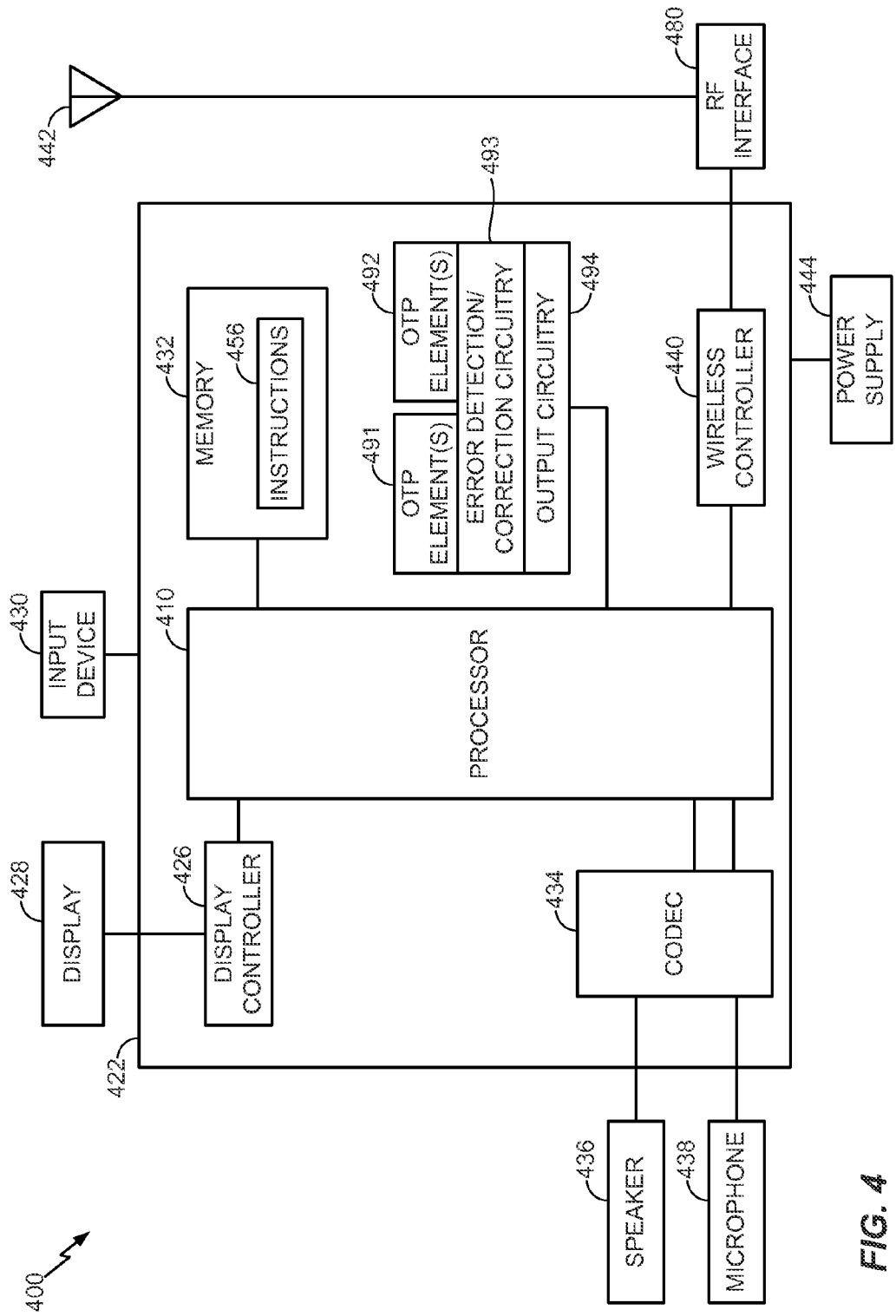
FIG. 4 is a block diagram of a wireless device including components operable to perform error detection and correction of OTP elements.

Referring to FIG. 4, a block diagram of a wireless device 400 including components operable to perform error detection and correction of OTP elements is shown. The wireless device 400 includes a processor 410, such as a digital signal processor (DSP), coupled to a memory 432.

FIG. 4 also shows a display controller 426 that is coupled to the processor 410 and to a display 428. A coder/decoder (CODEC) 434 can also be coupled to the processor 410. A speaker 436 and a microphone 438 can be coupled to the CODEC 434. FIG. 4 also indicates that a wireless controller 440 can be coupled to the processor 410 and to an antenna 442 via a radio-frequency (RF) interface 480 disposed between the wireless controller 440 and the antenna 442. One-time-programmable (OTP) elements 491 and 492 may also be coupled to the processor 410, as shown. The OTP elements 491 and 492 may correspond to the OTP elements 102 and 112 of FIG. 1. The OTP elements 491 and 492 may be coupled to error detection and correction circuitry 493 and output circuitry 494. The error detection and correction circuitry 493 may correspond to the error detection and correction circuitry 120 of FIG. 1 and the output circuitry 494 may correspond to the output circuitry 140 of FIG. 1.

The memory 432 may be a tangible non-transitory processor-readable storage medium that includes executable instructions 456. The instructions 456 may be executed by a processor, such as the processor 410, to perform or initiate performance of one or more of the operations, functions, and/or method described herein, such as the method 300 of FIG. 3. The instructions 456 may also be executable by an alternative processor of the wireless device 400 (not shown) that is coupled to the processor 410. For example, the processor 410, while executing the instructions 456, may perform (or initiate) a read operation on the OTP elements 491 and 492. Thus, execution of the instructions 456 by the processor 410 may cause (or initiate) generation of a first flag (e.g., the first flag 133 of FIG. 1), generation of a second flag (e.g., the second flag 134 of FIG. 1), and generation of a read output (e.g., the OTP read result 150 of FIG. 1).

In a particular embodiment, the processor 410, the display controller 426, the memory 432, the CODEC 434, and the wireless controller 440 are included in a system-in-package or system-on-chip device 422. In a particular embodiment, an input device 430 and a power supply 444 are coupled to the system-on-chip device 422. Moreover, in a particular embodiment, as illustrated in FIG. 4, the display 428, the input device 430, the speaker 436, the microphone 438, the antenna 442, and the power supply 444 are external to the system-on-chip device 422. However, each of the display 428, the input device 430, the speaker 436, the microphone 438, the antenna 442, and the power supply 444 can be coupled to a component of the system-on-chip device 422, such as an interface or a controller.

In conjunction with the described embodiments, an apparatus includes a first OTP element, a second OTP element, and means for receiving a first representation of data from the first OTP element. For example, the means for receiving may include the local data path 107, the local data path 117, the error detection and correction circuitry 120, the first decoder 122, the second decoder 124, the error detection and correction circuitry 493, one or more other devices, circuits, modules, or instructions to receive data from an OTP element, or any combination thereof.

The apparatus also includes means, responsive to an output of the means for receiving, for outputting an OTP read result based on the first representation of the data from the first OTP element or based on a second representation of the data from the second OTP element. For example, the means for outputting may include the output circuitry 140, the output logic 142, the MUX 144, the output circuitry 494, one or more other devices, circuits, modules, or instructions to output data, or any combination thereof.

Figure 5:
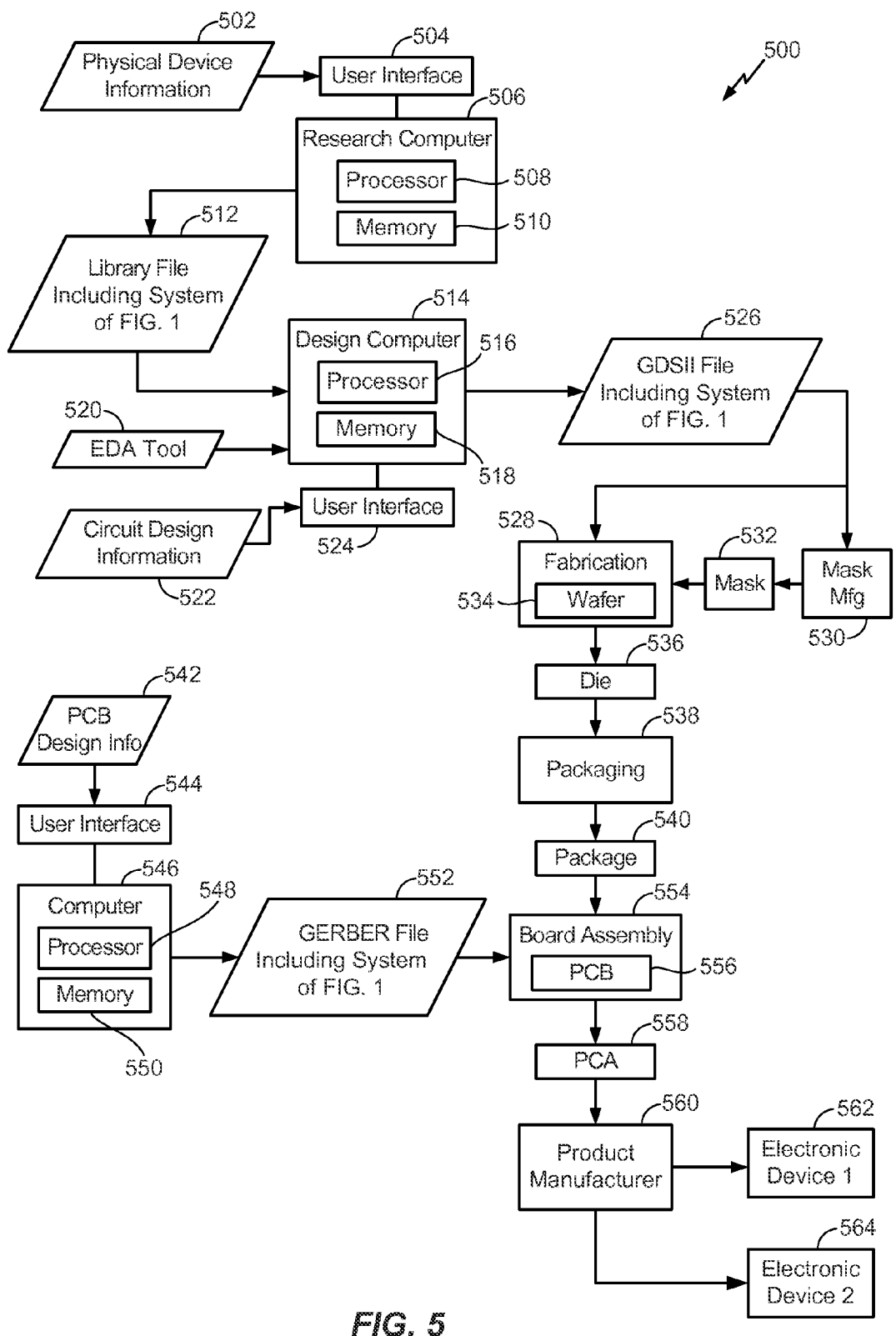
FIG. 5 is a data flow diagram of a particular illustrative embodiment of a manufacturing process to manufacture electronic devices that include components operable to perform error detection and correction of OTP elements.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 5 depicts a particular illustrative embodiment of an electronic device manufacturing process 500.

Physical device information 502 is received at the manufacturing process 500, such as at a research computer 506. The physical device information 502 may include design information representing at least one physical property of a semiconductor device, such as a device that includes the system 100 of FIG. 1 and/or component(s) thereof (e.g., the OTP elements 102, the OTP elements 112, the error detection and correction circuitry 120, the output circuitry 140, etc.). For example, the physical device information 502 may include physical parameters, material characteristics, and structure information that is entered via a user interface 504 coupled to the research computer 506. The research computer 506 includes a processor 508, such as one or more processing cores, coupled to a computer readable medium such as a memory 510. The memory 510 may store computer readable instructions that are executable to cause the processor 508 to transform the physical device information 502 to comply with a file format and to generate a library file 512.

In a particular embodiment, the library file 512 includes at least one data file including the transformed design information. For example, the library file 512 may include a library of semiconductor devices, including the system 100 of FIG. 1 and/or component(s) thereof, that is provided for use with an electronic design automation (EDA) tool 520.

The library file 512 may be used in conjunction with the EDA tool 520 at a design computer 514 including a processor 516, such as one or more processing cores, coupled to a memory 518. The EDA tool 520 may be stored as processor executable instructions at the memory 518 to enable a user of the design computer 514 to design a device that includes the system 100 of FIG. 1 and/or component(s) thereof, of the library file 512. For example, a user of the design computer 514 may enter circuit design information 522 via a user interface 524 coupled to the design computer 514.

The circuit design information 522 may include design information representing at least one physical property of a semiconductor device that includes the system 100 of FIG. 1 and/or component(s) thereof. To illustrate, the circuit design property may include identification of particular circuits and relationships to other elements in a circuit design, positioning information, feature size information, interconnection information or other information representing a physical property of a semiconductor device.

The design computer 514 may be configured to transform the design information, including the circuit design information 522, to comply with a file format. To illustrate, the file formation may include a database binary file format representing planar geometric shapes, text labels, and other information about a circuit layout in a hierarchical format, such as a Graphic Data System (GDSII) file format. The design computer 511 may be configured to generate a data file including the transformed design information, such as a GDSII file 526 that includes information describing a device that includes the system 100 of FIG. 1 and/or component(s) thereof, and that also includes additional electronic circuits and components within the SOC.

The GDSII file 526 may be received at a fabrication process 528 to manufacture a semiconductor device that includes the system 100 of FIG. 1 and/or component(s) thereof, according to transformed information in the GDSII file 526. For example, a device manufacture process may include providing the GDSII file 526 to a mask manufacturer 530 to create one or more masks, such as masks to be used with photolithography processing, illustrated as a representative mask 532. The mask 532 may be used during the fabrication process to generate one or more wafers 534, which may be tested and separated into dies, such as a representative die 536. The die 536 includes a circuit including the system 100 of FIG. 1 and/or component(s) thereof.

The die 536 may he provided to a packaging process 538 where the die 536 is incorporated into a representative package 540. For example, the package 540 may include the single die 536 or multiple dies, such as a system-in-package (SiP) arrangement. The package 540 may be configured to conform to one or more standards or specifications, such as Joint Electron Device Engineering Council (JEDEC) standards.

Information regarding the package 540 may be distributed to various product designers, such as via a component library stored at a computer 546. The computer 546 may include a processor 548, such as one or more processing cores, coupled to a memory 550. A printed circuit board (PCB) tool may be stored as processor executable instructions at the memory 550 to process PCB design information 542 received from a user of the computer 546 via a user interface 544. The PCB design information 542 may include physical positioning information of a packaged semiconductor device on a circuit board, the packaged semiconductor device corresponding to the package 540 including the system 100 of FIG. 1 and/or component(s) thereof.

The computer 546 may be configured to transform the PCB design information 542 to generate a data file, such as a GERBER file 552 with data that includes physical positioning information of a packaged semiconductor device on a circuit board, as well as layout of electrical connections such as traces and vias, where the packaged semiconductor device corresponds to the package 540 including the system 100 of FIG. 1 and/or component(s) thereof. In other embodiments, the data file generated by the transformed PCB design information may have a format other than a GERBER format.

The GERBER file 552 may be received at a board assembly process 554 and used to create PCBs, such as a representative PCB 556, manufactured in accordance with the design information stored within the GERBER file 552. For example, the GERBER file 552 may be uploaded to one or more machines to perform various steps of a PCB production process. The PCB 556 may be populated with electronic components including the package 540 to form a representative printed circuit assembly (PCA) 558.

The PCA 558 may be received at a product manufacture process 560 and integrated into one or more electronic devices, such as a first representative electronic device 562 and a second representative electronic device 564. As an illustrative, non-limiting example, the first representative electronic device 562, the second representative electronic device 564, or both, may be selected from the group of a set top box, a music player, a video player, an entertainment unit, a navigation device, a communications device, a personal digital assistant (PDA), a fixed location data unit, and a computer, into which the system 100 of FIG. 1 and/or component(s) thereof is integrated. As another illustrative, non-limiting example, one or more of the electronic devices 562 and 564 may be remote units such as mobile phones, handheld personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. In addition to remote units according to teachings of the disclosure, embodiments of the disclosure may be suitably employed in any device which includes active integrated circuitry including memory and on-chip circuitry.

A device that includes the system 100 of FIG. 1 and/or component(s) thereof, may be fabricated, processed, and incorporated into an electronic device, as described in the illustrative process 500. One or more aspects of the embodiments disclosed with respect to FIGS. 1-4 may be included at various processing stages, such as within the library file 512, the GDSII file 526, and the GERBER file 552, as well as stored at the memory 510 of the research computer 506, the memory 518 of the design computer 514, the memory 550 of the computer 546, the memory of one or more other computers or processors (not shown) used at the various stages, such as at the board assembly process 554, and also incorporated into one or more other physical embodiments such as the mask 532, the die 536, the package 540, the PCA 558, other products such as prototype circuits or devices (not shown), or any combination thereof. Although various representative stages of production from a physical device design to a final product are depicted, in other embodiments fewer stages may be used or additional stages may be included. Similarly, the process 500 may be performed by a single entity or by one or more entities performing various stages of the process 500.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A circuit comprising:
a first one-time programmable (OTP) element;
a second OTP element;
error detection circuitry coupled to receive a first representation of data from the first OTP element and to receive a second representation of the data from the second OTP element; and
output circuitry responsive to an output of the error detection circuitry to output an OTP read result based on the first representation of the data or based on the second representation of the data from the second OTP element, wherein the output of the error detection circuitry includes a first flag indicating whether any uncorrectable errors are detected in the first representation of the data and a second flag indicating whether any uncorrectable errors are detected in the second representation of the data, and wherein the output circuitry generates a selection signal having a first value when the first flag is de-asserted and having a second value when the first flag is asserted and the second flag is de-asserted.

2. The circuit of claim 1, wherein the first OTP element is included in a first set of magnetic tunnel junction (MTJ) OTP elements.

3. The circuit of claim 1, wherein the second OTP element is included in a second set of magnetic tunnel junction (MTJ) OTP elements.

4. The circuit of claim 1, wherein the error detection circuitry comprises an error correction code (ECC) decoder.

5. The circuit of claim 4, wherein the ECC decoder comprises a single error correction (SEC) and double error detection (DED) (SEC-DEC) decoder.

6. The circuit of claim 1, wherein the error detection circuitry comprises a cyclic redundancy check (CRC) decoder.

7. The circuit of claim 1, wherein the output circuitry includes a multiplexer configured to select an error correction code (ECC) data output corresponding to a particular representation of the data in response to the selection signal, wherein the output circuitry is further configured to generate an error signal when the first flag and the second flag are asserted.

8. The circuit of claim 1, wherein the output circuitry is integrated into at least one semiconductor die.

9. The circuit of claim 1, wherein the output circuitry is integrated in a set top box, a music player, a video player, an entertainment unit, a navigation device, a communications device, a personal digital assistant (PDA), a fixed location data unit, a computer, or a combination thereof.

10. A method comprising:
generating a first flag based on a first representation of data stored in a first one-time programmable (OTP) element, wherein the first flag indicates whether the first representation of the data includes any uncorrectable errors;
generating a second flag based on a second representation of the data stored in a second OTP element, wherein the second flag indicates whether the second representation of the data includes any uncorrectable errors;
responsive to the first flag and the second flag, generating a read output based on the first representation of the data or the second representation of the data and
generating a selection signal having a first value when the first flag is de-asserted and having a second value when the first flag is asserted and the second flag is de-asserted.

11. The method of claim 10, further comprising:
performing a first error detection operation on the first representation of the data to generate the first flag; and
performing a second error detection operation on the second representation of the data to generate the second flag.

12. The method of claim 10, further comprising performing an error correction operation with respect to a particular representation of the data in response to determining that the particular representation of the data includes a correctable error.

13. The method of claim 10, wherein when the first flag indicates that the first representation of the data includes no uncorrectable errors and the second flag indicates that the second representation of the data includes at least one uncorrectable error, the read output is generated based on the first representation of the data.

14. The method of claim 10, wherein when the second flag indicates that the second representation of the data includes no uncorrectable errors and the first flag indicates that the first representation of the data includes at least one uncorrectable error, the read output is generated based on the second representation of the data.

15. The method of claim 10, wherein the first flag, the second flag, and the read output are generated at circuitry integrated into an electronic device.

16. An apparatus comprising:
a first one-time programmable (OTP) element;
a second OTP element;
means for receiving a first representation of data from the first OTP element and a second representation of the data from the second OTP element; and
means, responsive to an output of the means for receiving, for outputting an OTP read result based on the first representation of the data or based on a second representation of the data from the second OTP element, wherein the means for outputting includes a first flat indicating whether an uncorrectable errors are detected in the first representation of the data and a second flag indicating whether any uncorrectable errors are detected in the second representation of the data, and wherein the means for outputting generates a selection signal having a first value when the first flag is de-asserted and having a second value when the first flag is asserted and the second flag is de-asserted.

17. The apparatus of claim 16, wherein the first OTP element is included in a first set of magnetic tunnel junction (MTJ) OTP elements and wherein the second OTP element is included in a second set of MTJ OTP elements.

18. The apparatus of claim 16, wherein the means for receiving comprises error detection circuitry coupled to the first OTP element and to the second OTP element.

19. The apparatus of claim 18, wherein the means for outputting comprises a multiplexer configured to select an error correction code (ECC) data output corresponding to a particular representation of the data in response to the error detection circuitry indicating that no uncorrectable errors are detected in the particular representation of the data.

20. The apparatus of claim 16, wherein the means for receiving and the means for outputting are integrated in a set top box, a music player, a video player, an entertainment unit, a navigation device, a communications device, a personal digital assistant (PDA), a fixed location data unit, a computer, or a combination thereof.

21. A method comprising:
a step for generating a first flag based on a first representation of data stored in a first one-time programmable (OTP) element, wherein the first flag indicates whether the first representation of the data includes any uncorrectable errors;
a step for generating a second flag based on a second representation of the data stored in a second OTP element, wherein the second flag indicates whether the second representation of the data includes any uncorrectable errors;
a step for, responsive to the first flag and the second flag, generating a read output based on the first representation of the data or the second representation of the data, and
a step for generating a selection signal having a first value when the first flag is de-asserted asserted and having a second value when the first flag is asserted and the second flag is de-asserted.

22. The method of claim 21, wherein the step for generating the first flag, the step for generating the second flag, and the step for generating the read output are performed at circuitry integrated into an electronic device.

23. A non-transitory computer-readable medium comprising instructions that, when executed by a processor, cause the processor to:
cause generation of a first flag based on a first representation of data stored in a first one-time programmable (OTP) element, wherein the first flag indicates whether the first representation of the data includes any uncorrectable errors;
cause generation of a second flag based on a second representation of the data stored in a second OTP element, wherein the second flag indicates whether the second representation of the data includes any uncorrectable errors;
responsive to the first flag and the second flag, cause generation of a read output based on the first representation of the data or the second representation of the data; and
cause generation of a selection signal having a first value when the first flag is de-asserted and having a second value when the first flag is asserted and the second flag is de-asserted.

24. The non-transitory computer-readable medium of claim 23, wherein the processor is integrated into a set top box, a music player, a video player, an entertainment unit, a navigation device, a communications device, a personal digital assistant (PDA), a fixed location data unit, a computer, or a combination thereof.

25. A method comprising:
receiving design information representing at least one physical property of a semiconductor device, the semiconductor device comprising:
a first one-time programmable (OTP) element;
a second OTP element;
error detection circuitry coupled to receive a first representation of data from the first OTP element and to receive a second representation of the data from the second OTP element; and
output circuitry responsive to an output of the error detection circuitry to output an OTP read result based on the first representation of the data or based on the second representation of the data from the second OTP element, wherein the output of the error detection circuitry includes a first flag indicating whether any uncorrectable errors are detected in the first representation of the data and a second flag indicating whether any uncorrectable errors are detected in the second representation of the data, and wherein the output circuitry generates a selection signal having a first value when the first flag is de-asserted and having a second value when the first flag is asserted and the second flag is de-asserted;

transforming the design information to comply with a file format; and generating a data file including the transformed design information.

26. The method of claim 25, wherein the data file comprises a GDSII format.

27. The method of claim 25, wherein the data file comprises a GERBER format.

* * * * *